(12) United States Patent
Gardell et al.

(10) Patent No.: US 10,041,976 B2
(45) Date of Patent: Aug. 7, 2018

(54) GIMBAL ASSEMBLY TEST SYSTEM AND METHOD

(71) Applicant: GLOBALFOUNDRIES INC., Grand Cayman (KY)

(72) Inventors: David L. Gardell, Fairfax, VT (US); David M. Audette, Colchester, VT (US); Peter W. Neff, Cambridge, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 67 days.

(21) Appl. No.: 15/014,479

(22) Filed: Feb. 3, 2016

(65) Prior Publication Data

US 2017/0219626 A1 Aug. 3, 2017

(51) Int. Cl.
| | | |
|---|---|---|
| *G01R 1/073* | (2006.01) | |
| *G01R 33/00* | (2006.01) | |
| *G01R 35/00* | (2006.01) | |
| *G01R 31/24* | (2006.01) | |
| *G01R 31/44* | (2006.01) | |
| *G01R 31/26* | (2014.01) | |

(52) U.S. Cl.
CPC ....... *G01R 1/07364* (2013.01); *G01R 1/0735* (2013.01); *G01R 31/24* (2013.01); *G01R 33/0017* (2013.01); *G01R 35/005* (2013.01); *G01R 31/2635* (2013.01); *G01R 31/44* (2013.01)

(58) Field of Classification Search
CPC .............. G01R 33/0017; G01R 35/005; G01R 31/31924; G01R 31/002; G01R 31/00; G01R 31/24; G01R 31/2635; G01R 31/44; H05B 37/03

USPC ........ 324/71, 378, 403, 415, 425, 500, 537, 324/750.01, 750.02
See application file for complete search history.

(56) References Cited

U.S. PATENT DOCUMENTS

| | | | |
|---|---|---|---|
| 7,084,651 B2 | 8/2006 | Audette et al. | |
| 2006/0022685 A1* | 2/2006 | Audette | ............ G01R 31/2886 324/750.25 |
| 2006/0181095 A1* | 8/2006 | Bonora | ............... H01L 21/6838 294/183 |
| 2007/0069759 A1* | 3/2007 | Rzepiela | ............ G01R 31/2831 324/762.05 |

(Continued)

FOREIGN PATENT DOCUMENTS

| | | |
|---|---|---|
| CN | 101099123 A | 1/2008 |
| TW | 198751 B | 1/1993 |
| TW | 201400231 A | 1/2014 |

OTHER PUBLICATIONS

Taiwanese Examination Report and English Translation thereof for Taiwanese Patent Application No. 106103210 dated Mar. 19, 2018, 15 pages.

*Primary Examiner* — Huy Q Phan
*Assistant Examiner* — Raul Rios Russo
(74) *Attorney, Agent, or Firm* — Michael LeStrange; Hoffman Warnick LLC

(57) ABSTRACT

Aspects of the present disclosure provide a gimbal assembly test system including: a protective cover affixed to a test surface of a wafer probe card mounted within a gimbal bearing, wherein the protective cover includes an exterior surface oriented outward from the test surface of the wafer probe card; and a recess extending into the exterior surface of the protective cover and shaped to matingly engage a load cell tip therein.

4 Claims, 7 Drawing Sheets

(56) References Cited

U.S. PATENT DOCUMENTS

| | | | |
|---|---|---|---|
| 2008/0030211 A1* | 2/2008 | Sinsheimer | G01R 31/2891 324/750.16 |
| 2008/0030214 A1* | 2/2008 | Nguyen | G01R 1/06727 324/754.03 |
| 2008/0079449 A1* | 4/2008 | Hobbs | G01R 1/07364 324/750.25 |
| 2008/0186040 A1* | 8/2008 | Hobbs | G01R 31/2863 324/750.28 |
| 2011/0089965 A1* | 4/2011 | Endres | G01R 35/00 324/755.01 |
| 2014/0021970 A1* | 1/2014 | Endres | G01R 35/00 324/750.02 |

* cited by examiner

GIMBAL ASSEMBLY TEST SYSTEM AND METHOD

TECHNICAL FIELD

The subject matter disclosed herein relates to a gimbal assembly test system and method. More specifically, aspects of the present disclosure relate to systems and methods for determining various attributes of a wafer probe card within a gimbal assembly system including, as one example, a gimbaling capacity of the probe.

BACKGROUND

In flip chip processing of semiconductor integrated circuit (IC) chips, interconnect structures such as solder bumps are used to connect IC chips to packaging. To determine the field viability of an IC chip, a probe card including an array of individual probes can contact the various solder bumps to create electrical connections and thereby test circuits within the wafer before it is diced and packaged. To accommodate variations in planarity between the probe card and wafer, the probe card can be mounted within a gimbal bearing which permits movement about and relative to at least two reference axes within a predetermined space. An example of a gimbal bearing for a probe card is shown and described in U.S. Pat. No. 7,084,651. Variability between individual gimbal bearings can affect the results of a test. Specifically, the testing quality of a gimbal assembly can vary based on the ability of such bearings to move in response to forces and torques applied to the device.

BRIEF SUMMARY

A first embodiment of the present disclosure provides a gimbal assembly test system including: a protective cover affixed to a test surface of a wafer probe card mounted within a gimbal bearing, wherein the protective cover includes an exterior surface oriented outward from the test surface of the wafer probe card; and a recess extending into the exterior surface of the protective cover and shaped to matingly engage a load cell tip therein.

A second embodiment of the present disclosure provides a gimbal assembly test system including: a load cell tip substantially aligned with a protective cover of a wafer probe card, wherein the load cell tip is configured to impart a force against the protective cover; a positional sensor operatively coupled to an exterior surface of the protective cover and configured to determine a first height differential between a first point on the exterior surface and a reference point; and a controller operably connected to each of the probe and the positional sensor, wherein the controller measures a planarity of the wafer probe card based on the first height differential, and calculates a correlation between the force against the protective cover and the planarity of the wafer probe card.

A third embodiment of the present disclosure provides a method for testing a gimbal assembly, the method including: imparting a force against an exterior surface of a protective cover affixed to a wafer probe card within the gimbal assembly; measuring a planarity of the wafer probe card relative to the gimbal assembly during the imparting of the force; and calculating a correlation between the force against the protective cover and the planarity of the wafer probe card.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the present disclosure can provide systems and methods for testing gimbal bearing assemblies, e.g., by determining the ability of a gimbal bearing (also known as a "spherical bearing"), and components mechanically coupled thereto, of a gimbal assembly to move based on applied forces. A gimbal bearing refers to a ball-and-socket type setting for a component, in which the component positioned within the gimbal bearing can be pivoted around and moved relative to two axes, thereby providing a predefined range of three-dimensional movement. Embodiments of the present disclosure can calculate the correlation between a force applied to the wafer probe card and a resulting planarity of the wafer probe card. The term "force," as used herein, can be substituted for torque, pressure, and/or other mechanical inputs based on the intended use of a wafer probe card and/or the applicable embodiment. A test system in an embodiment of the present disclosure can include a protective cover affixed to a test surface of a wafer probe card mounted within a gimbal bearing. The protective cover can include an exterior surface oriented outward from the test surface of the wafer probe card. A recess, shaped to matingly engage a probe, can extend into the exterior surface of the protective cover and can be laterally offset from the center of the exterior surface.

Figure 1:
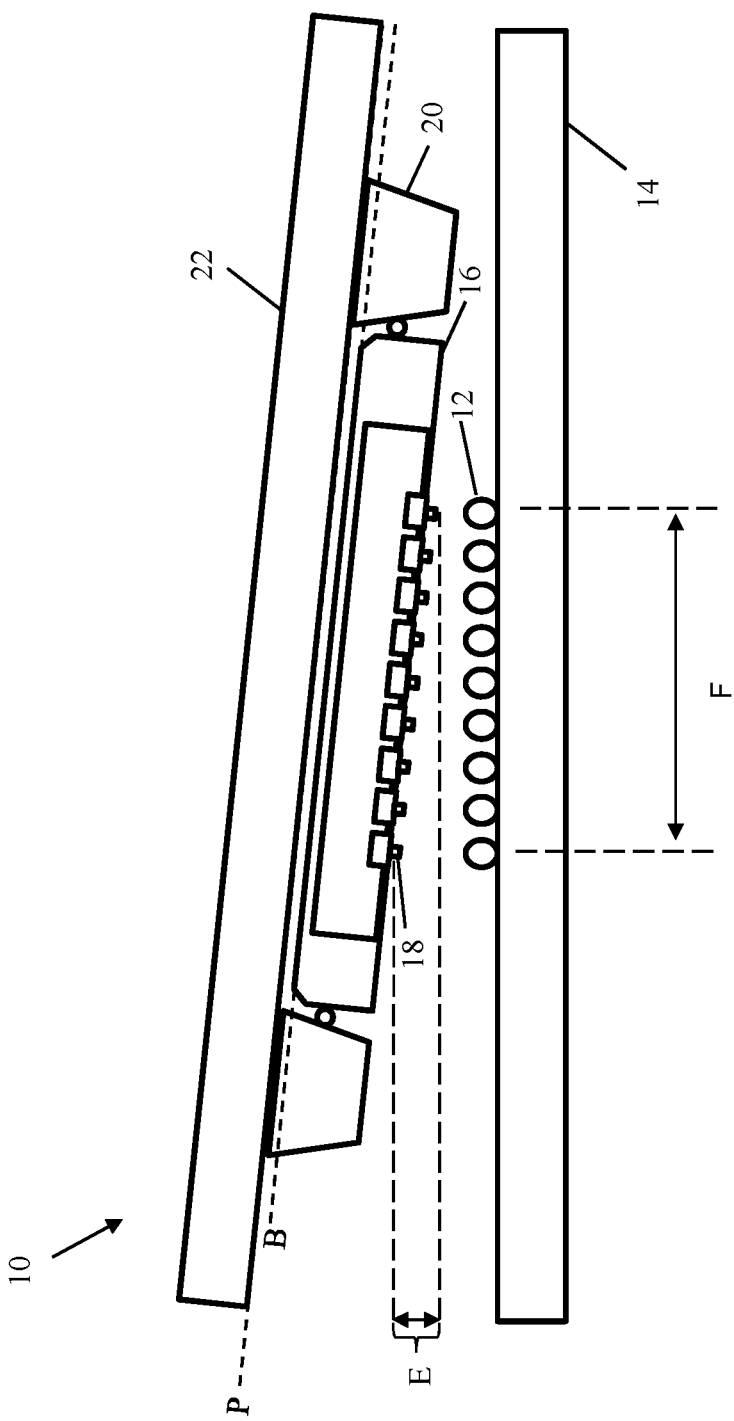
FIG. 1 shows a side view of a wafer about to be tested by a conventional probe.

Referring to FIG. 1, a conventional gimbal assembly 10 is shown. Embodiments of the present disclosure, discussed elsewhere herein, can operate on gimbal assembly 10 to evaluate its response to contacting an array of solder bumps 12 positioned on a wafer 14. Gimbal assembly 10 can include a wafer probe card 16 with an array of probes 18 thereon. Each probe 18 can be shaped and positioned to contact a corresponding solder bump 12. In addition, probes 18 can be provided as conductive contacts for providing an electrical connection to circuitry housed within an interior (not shown) of wafer probe card 16, and wafer probe card 16 may be connected electrically to a device interface board 22 via flexible wires, pogo pins, and/or other means configured to move with wafer probe card 16 during a test. Probes 18 can be embodied, e.g., as electrical contacts for communicating a current to circuitry within wafer 14, e.g., through solder bumps 12. Although probes 18 are shown in FIGS. 3-6 and described herein as being provided as rigid probes, embodiments of the present disclosure can be applied to gimbal assemblies 10 for testing other types of probes, e.g., buckling beam and/or cantilever probes. Wafer probe card 16 can be mounted within a gimbal bearing 20, which in turn can be mechanically coupled to a device interface board 22. The mounting of wafer probe card 16 within gimbal bearing 20 can allow wafer probe card 16 to move within gimbal bearing 20 based on external forces. In particular, solder bumps 12 can contact probes 18 to impart a gimbaling force (also identified as a "stress") against wafer probe card 16.

Wafer probe card 16 can move within gimbal bearing 20 in response to external forces, including contact with solder bumps 12 on wafer 14. When gimbal probe assembly 10 and wafer 14 are first installed in test system (not shown), probe card 16 may not be perfectly parallel to the wafer due to mechanical tolerances and thermal and mechanical stress. Some probes 18 can therefore contact respective solder bumps 12 before other probes 18. The degree of angular offset between wafer 14 and probe card 16 can be indicated, e.g., by a planarity error E in the amount of, e.g., approximately fifty micrometers (μm) for wafers 14 with a solder ball array size of approximately twenty millimeters (mm). Gimbal bearing 20 can operate by any currently-known or later developed mechanical arrangement for providing an adjustable planarity of wafer probe card 16 relative to device interface board 22, e.g., ball-and-socket joints, rolling and/or ball-type bearings, etc. A ball-type bearing is shown in the accompanying FIGS. 1-6 as an example. In the example of FIG. 1, gimbal bearing 20 can permit wafer probe card 16 to move as probes 18 contact solder bumps 12, and thereby mechanically account for planarity error E.

Figure 2:
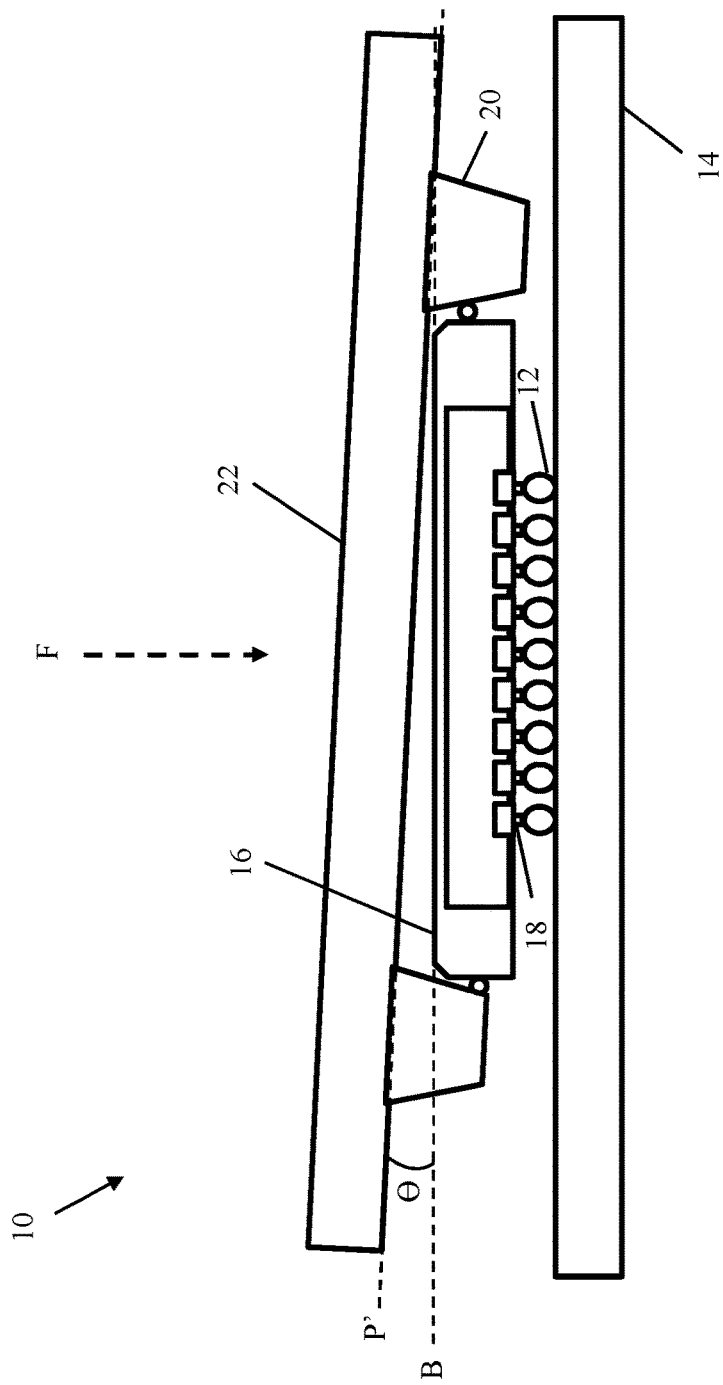
FIG. 2 shows a side view of the conventional probe contacting the wafer and rotating within a gimbal bearing.

At rest (i.e., before gimbal assembly 10 contacts solder bumps 12), device interface board 22 can have a planarity P substantially parallel to a planarity B of wafer probe card 16. Referring to FIG. 2, a downward force F can place gimbal assembly 10 into contact with solder bumps 12. Contact between gimbal assembly 10 and solder bumps 12 can cause wafer probe card 16 to move relative to device interface board 22. Wafer probe card 16 can move within gimbal bearing 20 when contacting solder bumps 12 by an amount based on, e.g., physical characteristics (e.g., sizing of solder bumps 12, differences in initial orientation of wafer 14 and wafer probe card 16, etc.). As a result, the planarity of device interface board 22 can be oriented in the direction of line P', such that the planarity P' of device interface board 22 is displaced from planarity B of wafer probe card 16 by an angular differential θ. To determine the operability of various probe card assemblies 10, embodiments of the present disclosure can calculate a correlation between the amount of force applied to probes 18 and the planarity of wafer probe card 16 relative to device interface board 22 (expressed, e.g., in terms of angular differential θ). If excessive force is required to change planarity from, e.g., the state shown in FIG. 1 to the state shown in FIG. 2, the solder balls on the right side of FIG. 1 may become damaged. The amount of damage can be calculated from the initial force, angular difference and stiffness of solder bumps 12. Embodiments of the present disclosure can measure the force vs angle of probe card 16 before it is used to test wafers.

Figure 3:
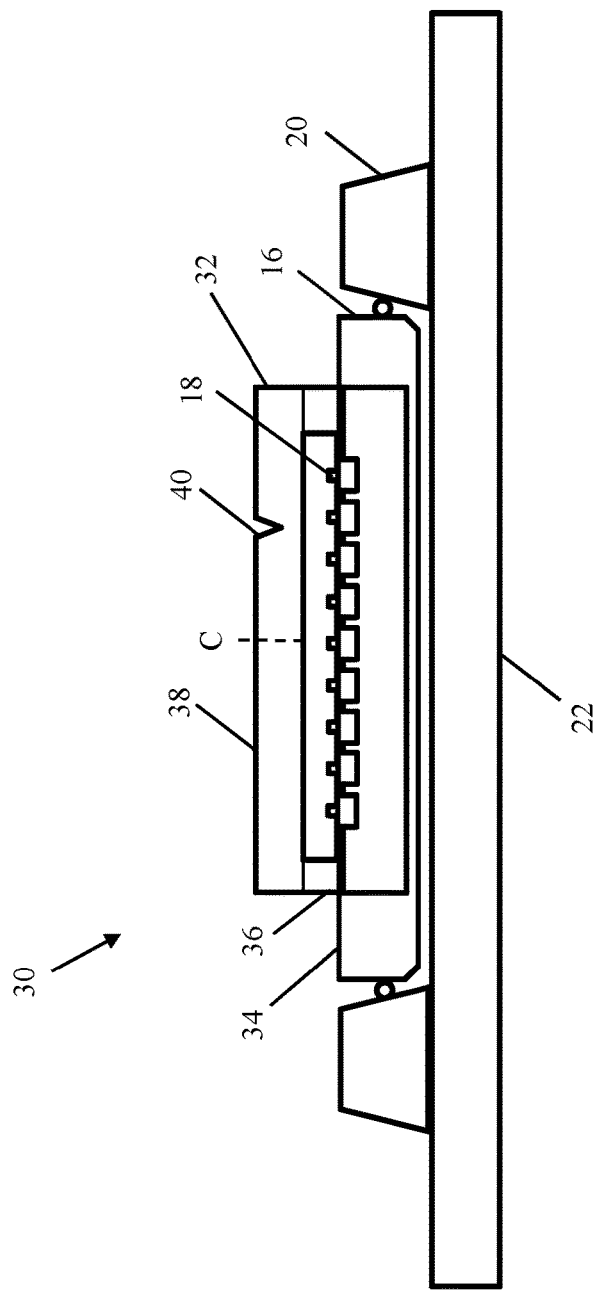
FIG. 3 shows a side view of a gimbal assembly test system according to embodiments of the present disclosure.

Turning to FIG. 3, a side view (vertically reversed from FIGS. 1-2) of a gimbal assembly test system 30 is shown according to embodiments of the present disclosure. Gimbal assembly test system 30 can include a protective cover 32 affixed to a test surface 34 of wafer probe card 16. Test surface 34 can generally be identified as an exterior surface of wafer probe card 16 where probes 18 are positioned. Protective cover 32 can be composed of a rigid material capable of structurally withstanding impacts, torques, etc., imparted by external devices over time, and in an example embodiment can be composed of one or more metals, metal alloys, plastics, composite materials, etc. In addition or alternatively, protective cover 32 can have the same material composition as wafer probe card 16. Protective cover 32 can be mechanically affixed to test surface 34, e.g., through a rim 36 positioned on test surface 34, such that protective cover 32 remains stationary relative to wafer probe card 16 as wafer probe card 16 moves relative to device interface board 22. Rim 36 can be coupled to test surface 34 of wafer probe card 16 by way of, e.g., mating engagement, mechanical couplings, dowel pins, and/or any other currently known or later developed form of mechanical coupling. Rim 36, in addition, can be positioned circumferentially about probes 18 such that protective cover 32 circumferentially encloses probes 18 of wafer probe card 16 therein. Rim 36 and cover 32 may be separate parts coupled or monolithic.

Protective cover 32 can include an exterior surface 38 oriented to face outward from test surface 34 of wafer probe card 16. Test surface 34 and exterior surface 38 can be oriented to be approximately parallel to each other, such that the angular facing of test surface 34 copies that of exterior surface 38. As used herein, the term "approximately" in relation to a specified numerical value (including percentages of base numerical values) can include all values within ten percentage points of (i.e., above or below) the specified numerical value or percentage, and/or all other values which cause no operational difference or substantial operational difference between the modified value and the enumerated value. In the case of two surfaces having an "approximately parallel" orientation, an angular differential between the two surfaces can be less than e.g., approximately five degrees. The term approximately can also include other specific values or ranges where specified herein.

Figure 4:
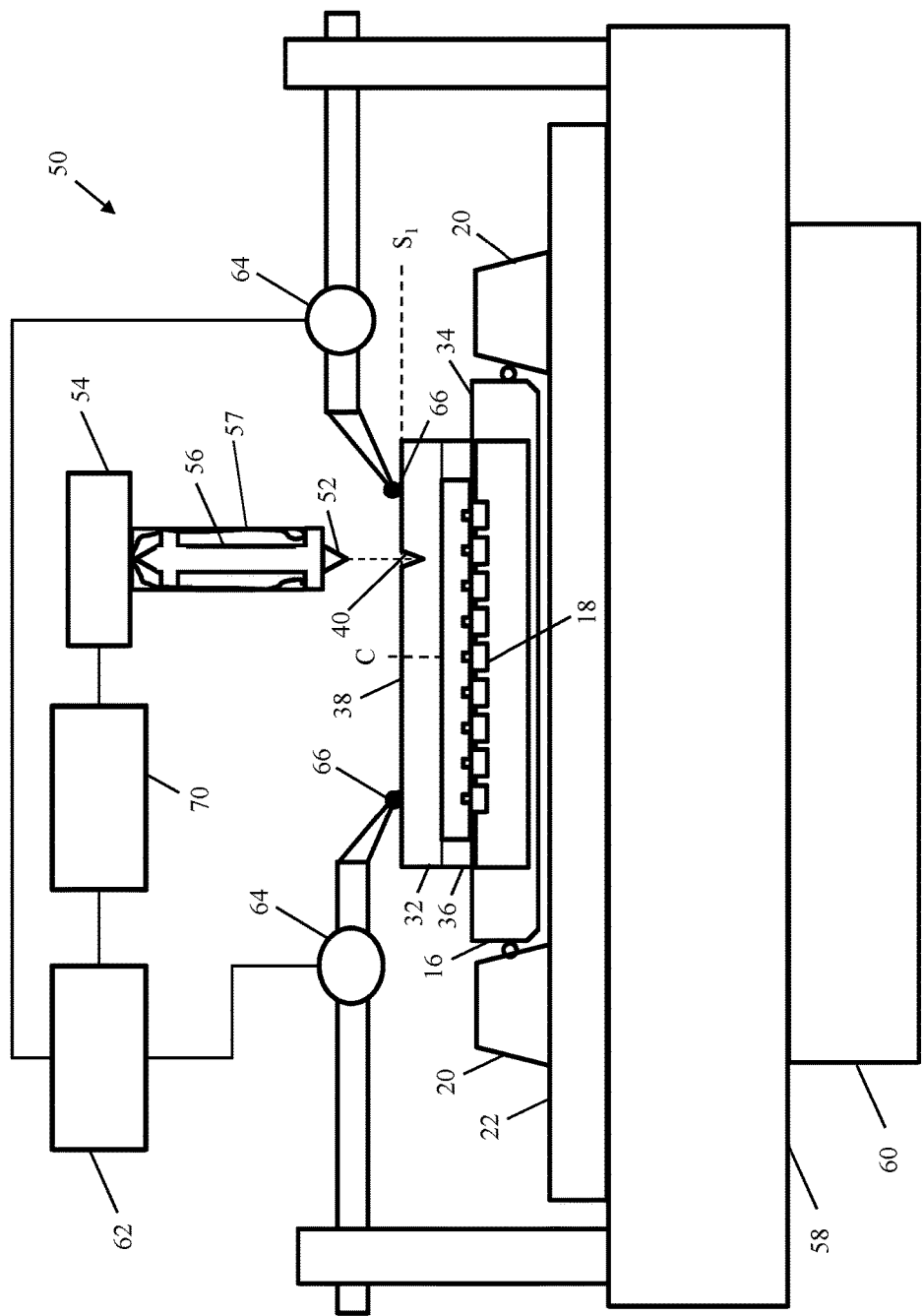
FIG. 4 shows a side view of a gimbal assembly test system with a protective cover substantially aligned with a force probe according to embodiments of the present disclosure.

A recess 40 can extend into exterior surface 38 of protective cover 32, such that recess 40 can matingly engage a complimentary-shaped component or fixture. Recess 40 can be formed, e.g., by removing a portion of protective cover 32 without creating a complete aperture to expose probe(s) 18 masked by protective cover 32. As shown in FIG. 4, recess 40 can be laterally offset from center C of exterior surface 38 by a predetermined distance, such that a downward force applied to recess 40 can cause wafer probe card 16 and protective cover 32 to move within gimbal bearing 20. It is understood, however, that recess 40 can be coincident with center C of exterior surface 38 in alternative embodiments. The recess may also be located a predetermined distance inboard of the perimeter of the array of probes 18. There can be more than one recess 40 to facilitate testing probes 18 with different array sizes with the same protective cover 32. Recess 40, although shown in FIGS. 3-6 as being in the form of a divot, can be provided as any currently known or later developed type of indentation for engaging a static or moving component of a mechanical device. For example, recess 40 may be provided as a socket for engaging a ball component of a ball-and-socket joint, and/or an indentation shaped to matingly engage one or more load-imparting components as discussed herein.

Forces applied to protective cover 32 (e.g., at recess 40) can cause movement and planar reorientation of wafer probe card 16 and protective cover 32 within gimbal bearing 20. As is discussed elsewhere herein, applying a force to protective cover 32 at recess 40 can allow embodiments of the present disclosure to calculate a correlation between the planarity of wafer probe card 16 and the applied force, without probe(s) 18 being directly contacted. More specifically, protective cover 32 and recess 40 can allow various components to impart forces, torques against wafer probe card 16 without affecting the operability of its electrical components, including probe(s) 18. Protective cover 32 can be composed wholly or partially of, e.g., one or more of the same materials used to fabricate wafer probe card 16 and/or wafer 14 (FIGS. 1-2).

Turning to FIG. 4, a gimbal assembly test system 50 which includes wafer probe card 16, gimbal bearing 20, and protective cover 32 therein is shown. Recess 40 can be substantially aligned with a load cell tip 52 mechanically coupled to a length-adjustable member 56. Length-adjustable member 56 is shaped to exert a substantially vertical force on load cell 54, even if cover 32 and load cell tip 52 moves slightly sideways as it changes planarity, or in the event that load cell tip 52 is not aligned perfectly with recess 40 during a test. Thus, testing accuracy can be improved by minimizing any off center loads. Member 56 can be retained in a housing 57 that is in turn attached to load cell 54. In one embodiment, the outside diameter of the bottom of member 56 is substantially identical to an exterior diameter of housing 57 to indicate whether member 56 extends substantially vertically relative to reference surface 58.

Recess 40 of exterior surface 38 can be substantially aligned with load cell tip 52, regardless of where each component is positioned relative to others. The terms "substantially aligned," "substantial alignment," and variants thereof as used herein can refer to any alignment between two elements (e.g., between recess 40 and load cell tip 52) in which one element can be placed in contact with another by moving substantially along one axis. As such, substantial alignment can include direct alignment and/or alignments with an insubstantial lateral offset between the two substantially aligned components. Load cell tip 52 can have a shape complementary to that of recess 40, such that recess 40 receives load cell tip 52 therein as load cell tip 52 extends from load cell 54 at a predetermined rate. Recess 40 can include, e.g., sloped sidewalls for engaging an angled surface of load cell tip 52 to account for any lateral displacement between recess 40 and load cell tip 52.

Length-adjustable member 56 can be provided as any currently-known or later developed device for providing a variable length. For example, length-adjustable member 56 can be embodied as one or more of, e.g., screw threads, a linear actuator, a piezoelectric actuator, a pneumatic actuator, a servo actuator, a hydraulic actuator, a motor-driven actuator, and/or any other currently known or later-developed mechanism for adjusting a component length. Although length-adjustable member 56 can be used as a driving means for load cell tip 52 (e.g., by being coupled to a motor or similar driving mechanism), length-adjustable member can additionally or alternatively be an adjustment mechanism for allowing member 56 to be coupled to housing 57 with adjustment for wear and assembly tolerance. In addition, a spring (not shown) can couple member 56 to housing 57 such that the spring, coupled between member 56 and housing 57, can urge member 56 upwards into housing 57 when load cell 54 is not in use. In addition, member 56 can be pivotally connected to housing 57 at the end opposing load cell tip 52, such that portions of member 56 (located, e.g., proximal to load cell tip 52) can move back and forth to some degree within housing 57. The amount of pivoting motion permitted by member 56 within housing 57 can depend, in part, on the exterior diameter of member 56 relative to housing 57.

In embodiments of the present disclosure, load cell tip 52 of load cell 54 can strike recess 40 to cause wafer probe card 16 to move within gimbal bearing 20. To test the engagement between wafer probe card 16 and gimbal bearing 20 (e.g., quantify an amount of gimbaling capacity), device interface board 22 can be positioned on a substantially flat, horizontally-oriented reference surface 58. Reference surface 58 can be composed of any conceivable solid material for providing a stiff, horizontal reference plane and in one embodiment can be composed of granite. Reference surface 58 can thereby provide a planar reference area to measure the movement of wafer probe card 16 within gimbal bearing 20. Reference surface 58, in turn, can be positioned on a stage 60 in an external environment, e.g., a testing area, chamber, booth, etc. Stage 60 may be a separate fixture or may form part of other components (e.g., integrated test assemblies) in a particular environment. Stage 60 may be a three-dimensional positioning stage for aligning load cell tip 52 with recess 40 within a horizontal (e.g., X-Y) reference plane, movement along axis Z may be used for applying force through load cell 54, e.g., by way of load cell tip 52, member 56, and housing 57. To provide a stronger spatial interrelation between the components of gimbal assembly test system 50, stage 60 and load cell 54 may be connected by an external load frame (not shown).

Figure 5:
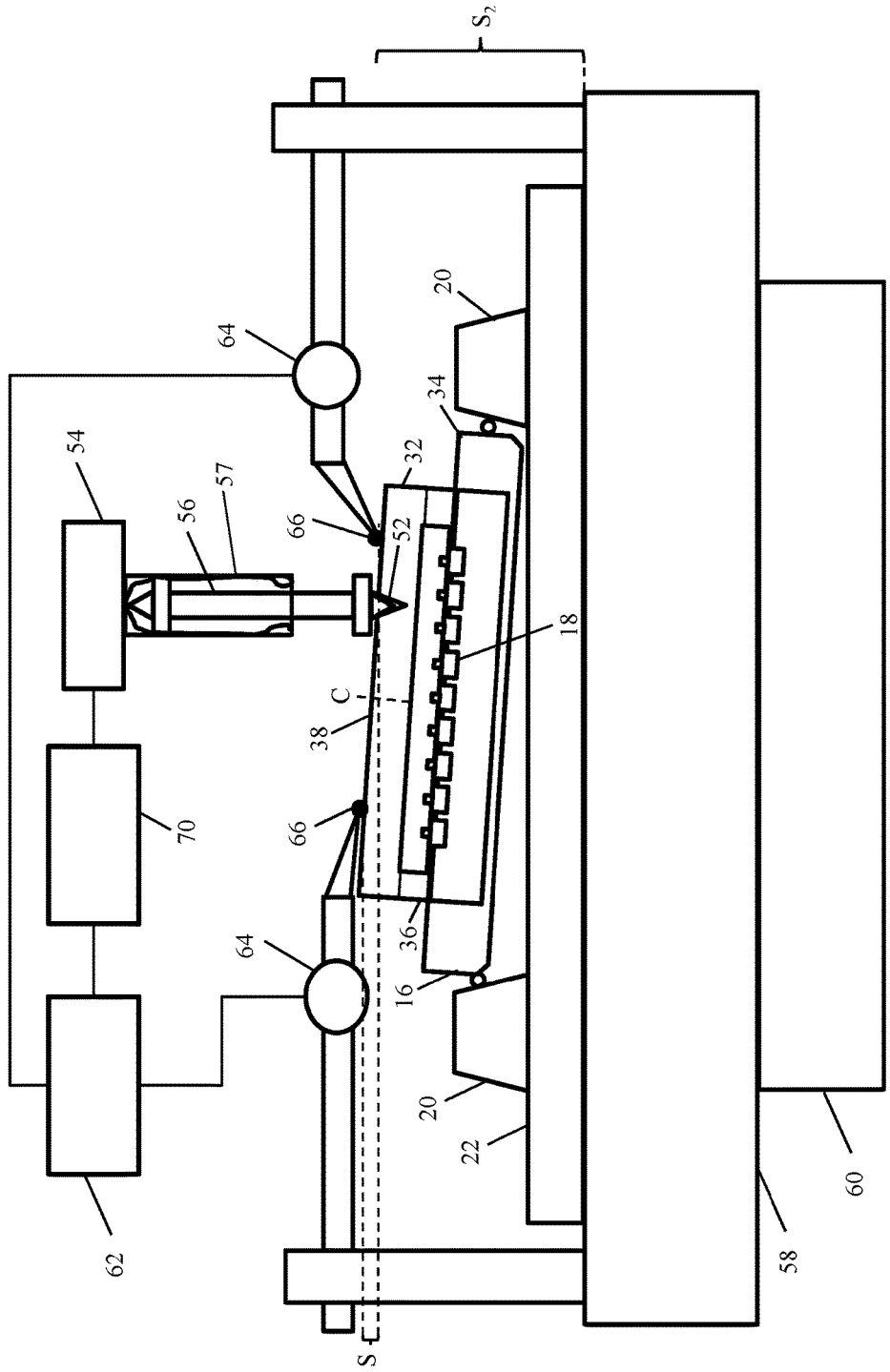
FIG. 5 shows a side view of a gimbal assembly test system being struck by a load cell tip according to embodiments of the present disclosure.

Referring to FIGS. 4 and 5 together, gimbal assembly test system 50 can include a positional sensor 62 operatively coupled to protective cover 32. Positional sensor 62 can determine height differential(s) "$S_1$," "$S_2$," e.g., between a first point on exterior surface 38 and a reference point in space (e.g., reference surface 58) to indicate a planarity of wafer probe card 16 in one coordinate direction. Positional sensor 62 can be embodied as any currently-known or later-developed instrument for identifying heights, positions, etc., relative to a horizontal reference plane (e.g., reference surface 58). For example, positional sensor can include an optical sensor, electrical sensor, electronic level, magnetic sensor, laser sensor, capacitive sensor, angle sensor, camera(s), and/or other types of sensors for indicating and/or otherwise deriving a position based on an input. In an example embodiment, positional sensor 62 can be in communication with two planarity sensors 64 (e.g., via any currently known or later developed type of data coupling, including wired and/or wireless data connections), coupled to respective probes 66. Each probe 66 can be placed in contact with corresponding first and second points on exterior surface 38 of protective cover 32.

As depicted in FIG. 4, each planarity sensor 64 can be coupled to reference surface 58, such that sensor 66 is calibrated to be at a corresponding height when wafer probe card 16 and protective cover 32 are stationary. At rest, wafer probe card 16 and protective cover 32 can be horizontally planar along (e.g., reference line $S_1$). Protective cover 32 being stationary and horizontally planar can cause each probe 66 to have approximately the same height. Load cell tip 52 imparting a force against protective cover 32, as shown in FIG. 5, can cause wafer probe card 16 and protective cover 32 to move within gimbal bearing 20. The movement of wafer probe card 16 and protective cover 32 within gimbal bearing 20 can cause exterior surface 38 of protective cover 32 to have a deflected planarity (extending, e.g., along reference line $S_2$). In addition, probes 66 at respective reference points on exterior surface 38 have now have a height differential "S." Planarity sensors 64 can transmit a signal indicating the position of probes 66 to positional sensor 62, which can derive a measurement of height differential S from the transmitted data. In an alternate embodiment, planarity sensors 64 measure only change in heights and thus change in planarity as the force is increased. In addition or alternatively, planarity sensors 64 could be replaced with a single optical or mechanical angle or level sensor.

Figure 6:
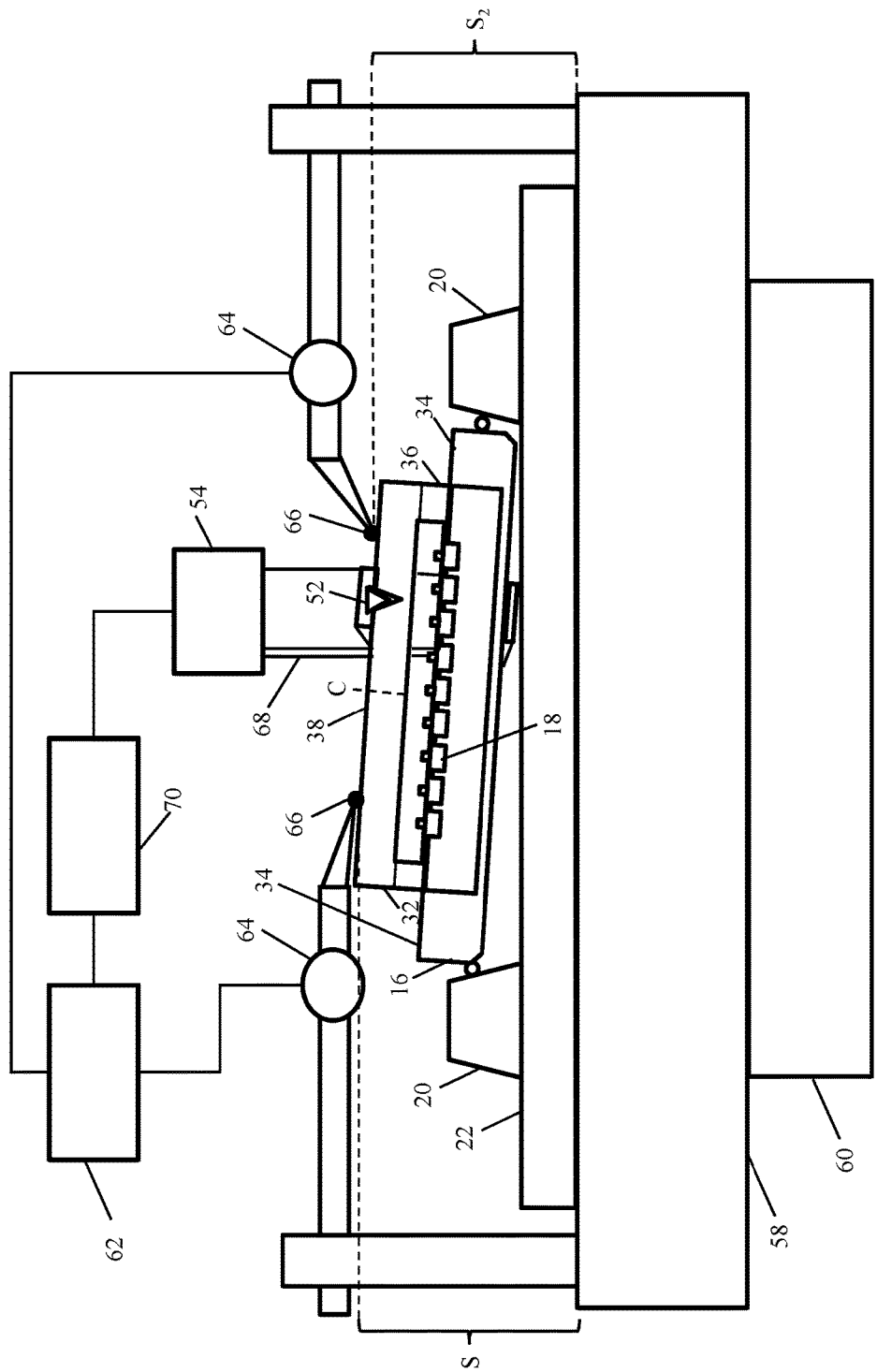
FIG. 6 shows a side view of a gimbal assembly test system with a torque wrench according to embodiments of the present disclosure.

Turning to FIG. 6, embodiments of the present disclosure can include alternative devices for imparting a force against protective cover 32. For example, as an addition or alternative to load cell 54 (FIGS. 4-5), load cell 54 of gimbal assembly test system 50 can include a torque wrench 68 configured to grip protective cover 32 at recess 40. Torque wrench 68 can thus impart a torque against wafer probe card 16 about center C of protective cover 32, e.g., vertically upwards or downwards within the plane of the page and/or into or out of the plane of the page such that wafer probe card 16 and protective cover 32 rotate about center C. The torque imparted to protective cover 32 with torque wrench 68 can cause wafer probe card 16 to move within gimbal bearing 20 in proportion to the amount of torque. Torque wrench 68 can also include an embodiment of load cell tip 52 configured to engage recess 40 of protective cover 32, and where applicable can impart a torque by moving protective cover 32 in a predetermined direction. Torque wrench 68 can thus simulate movement of wafer probe card 16 within gimbal bearing 20 within a single plane.

Referring to FIGS. 4-6 together, features for testing the performance of gimbal bearing 20 are discussed. Regardless of the mechanism used to move wafer probe card 16 and protective cover 32 within gimbal bearing 20, embodiments of the present disclosure can include additional devices for determining a relationship between motion of wafer probe card 16 and mechanical forces, torques, etc., applied thereto. For example, gimbal assembly test system 50 can include a controller 70 in communication with load cell 54 and positional sensor 62 by way of any currently known or later developed connection (e.g., wireless and/or wired data couplings). Controller 70 can be embodied as a computing device configured to compute a correlation between the amount of force applied by load cell 54 (e.g., through load cell tip 52 of length-adjustable member 56 and/or torque wrench 68) and the resulting height differential S (measured, e.g., with positional sensor 62). Where load cell 54 is operated using a computing device, and/or dedicated components of controller 70, a predetermined amount of force or torque can be transmitted to controller 70 as raw data. In addition, planarity sensors 64 can transmit the position of each probe 66 and/or recorded values of height differential S. Controller 70 can then pair data transmitted from load cell 54 with data from positional sensor 62 with corresponding units of time. Thereafter, controller 70 can determine a correlation between forces applied to protective cover 32 and the planarity of wafer probe card 16.

Figure 7:
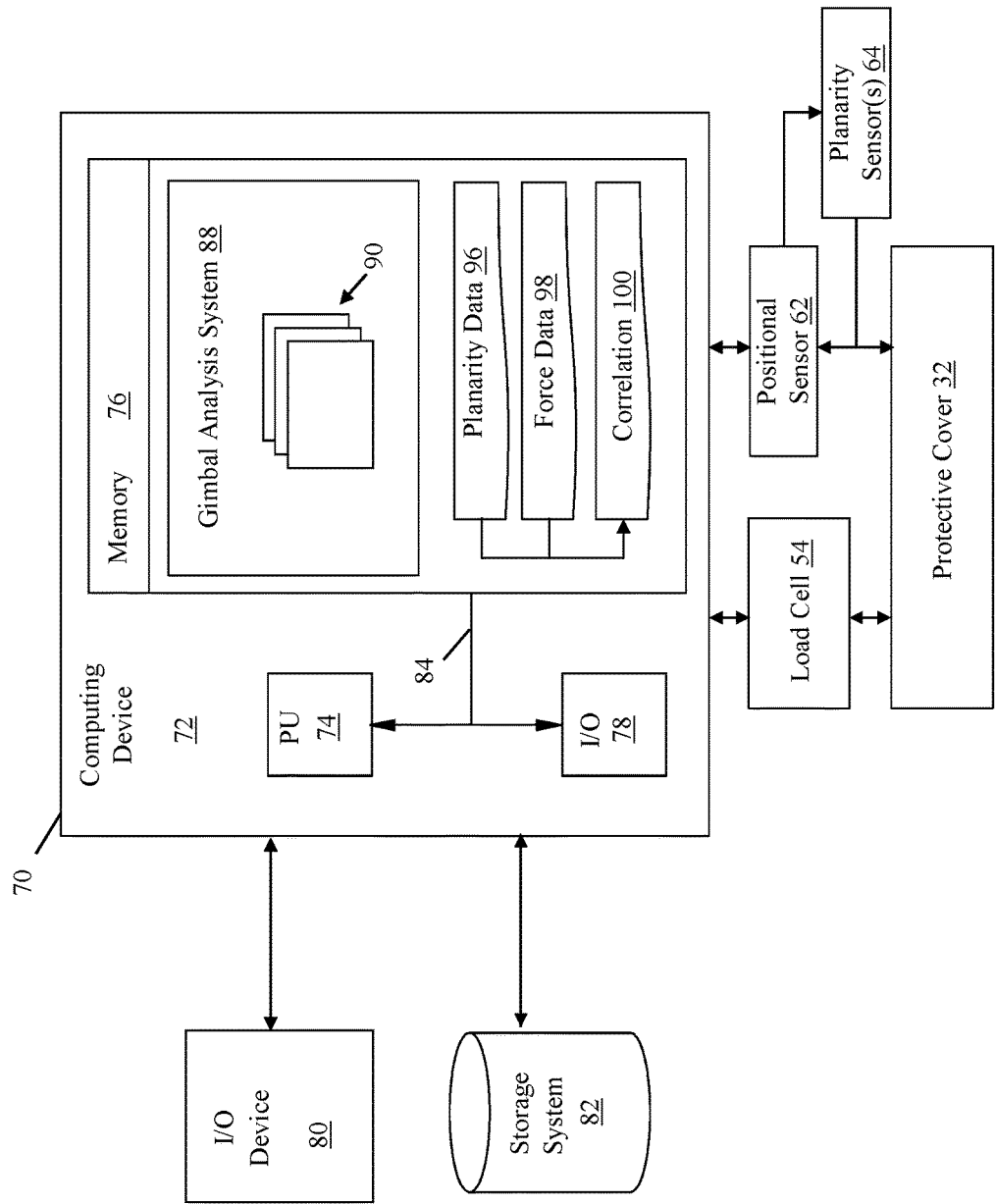
FIG. 7 provides a schematic view of a controller according to embodiments of the present disclosure.

Turning to FIG. 7, a schematic diagram of controller 70 and example components thereof is provided to illustrate systems and methods according to embodiments of the present disclosure. As discussed herein, controller 70 can placed in communication with load cell 54 and/or positional sensor 62 according to embodiments. To this extent, controller 70 can determine a correlation between applied forces and the corresponding planarity of wafer probe card 16 (FIGS. 3-6) and protective cover 32. Although one load cell 54 and one positional sensor 62 are shown by example in FIG. 7, it is understood that multiple load cells 54 and/or positional sensors 62 can be used where desired and/or applicable.

Controller 70 is shown to include a computing device 72 including a processing unit (PU) 74 (e.g., one or more processors), a memory 76 (e.g., a storage hierarchy), an input/output (I/O) component 78, an I/O device 80 (e.g., one or more I/O interfaces and/or devices), a storage system 82 and a communications pathway 84. In general, PU 74 executes program code, such as a gimbal analysis system 88 at least partially fixed in memory 76. While executing program code, PU 74 can process data, which can result in reading and/or writing transformed data from/to memory 76 and/or I/O device 80 for further processing. Pathway 84 provides a communications link between each of the components in computing device 72. I/O component 78 can comprise one or more human I/O devices, which enable a human or system user to interact with computing device 72 and/or one or more communications devices to enable user(s) to communicate with computing device 72 using any type of communications link. To this extent, gimbal analysis system 88 can manage a set of interfaces (e.g., graphical user interface(s), application program interface, etc.) that enable user(s) to interact with gimbal analysis system 88. Further, gimbal analysis system 88 can manage (e.g., store, retrieve, create, manipulate, organize, present, etc.) data using any solution.

Computing device 72 can comprise one or more computing devices, including specific-purpose computing articles of manufacture (e.g., computing devices) capable of executing program code, such as gimbal analysis system 88 installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, gimbal analysis system 88 can be embodied as any combination of system software and/or application software.

Further, gimbal analysis system 88 can be implemented using a set of modules 90, e.g., a calculator, comparator, a determinator, etc. In this case, each module can enable computing device 72 to perform a set of tasks used by gimbal analysis system 88, and can be separately developed and/or implemented apart from other portions of gimbal analysis system 88. One or more modules can display (e.g., via graphics, text, sounds, and/or combinations thereof) a particular user interface on a display component such as a monitor. When fixed in memory 76 of computing device 72 that includes PU 74, each module can be module a substantial portion of a component that implements the functionality. Regardless, it is understood that two or more components, modules and/or systems may share some/all of their respective hardware and/or software. Further, it is understood that some of the functionality discussed herein may not be implemented or additional functionality may be included as part of computing device 72.

Referring to FIGS. 5 and 7 together, methods according to the present disclosure can include imparting a force (e.g., signaling load cell 54 using controller 70) against protective cover 32 affixed to wafer probe card 16, e.g., at recess 40 laterally offset from center C of protective cover 32. The imparting of force against protective cover 32 can include, e.g., striking recess 32 with load cell tip 52, applying a torque to protective cover 32 at recess 40 with torque wrench

68 (FIG. 6), etc. Modules 90 of gimbal analysis system 88 can then pair planarity data 96 received from positional sensor 62 with force data 98 (e.g., an amount of force in Newtons (N) or torque in Newton meters (Nm) applied to protective cover 32) to derive a correlation 100 between force applied to exterior surface 38 of protective cover 32 and the resulting planarity of protective cover 32. In an example embodiment, modules 90 can also calculate height differential(s) $S_1$, $S_2$, between one or more points on exterior surface 38 of protective cover 32 and reference surface 58 to derive a planarity of exterior surface 38 and wafer probe card 16.

Modules 90 can also calculate other quantities relating to wafer probe card 16 and/or gimbal bearing 20 based on the calculated correlation. For example, modules 90 can calculate a gimbaling capacity of gimbal bearing 20 (expressed, e.g., in millimeters per Newton or units of distance per units of force) based on the correlation between applied forces and the resulting planarity of wafer probe card 16 and protective cover 32. Where the planarity of wafer probe card 16 and protective cover 32 can be expressed as a function of force and/or torque, gimbaling capacity generally quantifies the ability of protective cover 16 to move within gimbal bearing 20. Controller 70 can display or otherwise provide the calculated correlation and/or gimbaling capacity to a user, apply different forces and/or torques using load cell 54 based on the calculated correlation to further test wafer probe card 16, etc.

In addition or alternatively, modules 90 of gimbal analysis system 88 can determine whether wafer probe card 16 satisfies performance standards based on, e.g., the calculated correlation and/or gimbaling capacity. In an example embodiment, gimbaling capacity can be expressed as a predicted amount of movement, e.g., a height differential of approximately thirty μm resulting from an applied load of fifty kilograms (kg) applied to recess 40 positioned approximately nine mm from the center of wafer probe card 16. Gimbaling capacity of wafer probe card 16 in gimbal assembly 10 (FIGS. 1-2) can affect the quality of a test, e.g., because a sufficient gimbaling capacity can allow all probes 18 in gimbal assembly 10 to contact respective solder bumps 12 (FIGS. 1-2) when wafer probe card 16 contacts wafer 14 (FIGS. 1-2). To determine whether gimbal assembly 10 will move in accordance with desired levels, the calculated gimbaling capacity and/or correlation 100 can thereafter be compared to a predetermined performance standard (stored, e.g., within memory 76 and/or storage system 82). The performance standard can indicate, e.g., a minimum correlation and/or gimbaling capacity needed for acceptable electrical testing of solder bumps 12 with wafer probe card 16. Referring to the above-noted example of gimbaling capacity, a height differential of approximately thirty μm may be acceptable for some groups of arrays of solder bumps 12 but may not be acceptable for solder bump 12 arrays provided on other wafers 14. The electrical performance standard can thus be derived from the size of the solder bump array, the number of solder bumps, the hardness of the solder bumps and the position of the probes relative to, an anticipated planarity error E (FIG. 1) between wafer 14 and wafer probe card 16. A standard can also be developed from manufacturing data, past test results, etc. Where the hardness and density of solder bumps is known (e.g., by prior calculation, testing, etc.) the maximum compression of a solder bump 12 positioned at the edge of an array can be calculated from planarity and force. The maximum compression and/or anticipated damage for some solder bumps 12 can also be used as a gimbaling performance standard.

When computing device 72 comprises multiple computing devices, each computing device may have only a portion of gimbal analysis system 88 (e.g., one or more modules) thereon. However, it is understood that computing device 72 and gimbal analysis system 88 are only representative of various possible equivalent computer systems that may perform a process described herein. To this extent, in other embodiments, the functionality provided by computing device 72 and gimbal analysis system 88 can be at least partially implemented by one or more computing devices that include any combination of general and/or specific purpose hardware with or without program code. In each embodiment, the hardware and program code, if included, can be created using standard engineering and programming techniques, respectively.

Regardless, when computing device 72 includes multiple computing devices, the computing devices can communicate over any type of communications link. Further, while performing a process described herein, computing device 72 can communicate with one or more other computer systems using any type of communications link. In either case, the communications link can comprise any combination of various types of wired and/or wireless links; comprise any combination of one or more types of networks; and/or use any combination of various types of transmission techniques and protocols.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A method for testing a gimbal assembly, the method comprising:
   imparting a force against an exterior surface of a protective cover affixed to a wafer probe card within the gimbal assembly, wherein the imparting of the force against the exterior surface of the protective cover includes striking a recess extending into the exterior surface with a load cell tip shaped to matingly engage the recess, wherein the recess is laterally offset from a center of the protective cover;
   measuring a planarity of the wafer probe card relative to the gimbal assembly during the imparting of the force; and calculating a correlation between the force against the protective cover and the planarity of the wafer probe card.

2. The method of claim 1, further comprising calculating a gimbaling capacity of the gimbal bearing based on the calculated correlation between the force against the protective cover and the planarity of the wafer probe card.

3. The method of claim 2, further comprising determining whether the gimbaling capacity of the gimbal bearing satisfies a performance standard.

4. The method of claim 1, wherein the measuring of the planarity of the wafer probe card includes calculating a first height differential between a first point on the protective cover and a reference point.

* * * * *